(12) United States Patent
Hashimoto

(10) Patent No.: US 8,497,060 B2
(45) Date of Patent: Jul. 30, 2013

(54) MANUFACTURING METHOD OF SEMICONDUCTOR DEVICE

(75) Inventor: Koji Hashimoto, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/662,910

(22) Filed: May 11, 2010

(65) Prior Publication Data

US 2010/0221665 A1    Sep. 2, 2010

Related U.S. Application Data

(62) Division of application No. 11/727,537, filed on Mar. 27, 2007, now Pat. No. 8,158,333.

(30) Foreign Application Priority Data

Apr. 11, 2006  (JP) .................................. 2006-108940

(51) Int. Cl.
    *G03F 7/20*  (2006.01)
(52) U.S. Cl.
    USPC ............................. 430/313; 430/312; 430/314
(58) Field of Classification Search
    USPC ......................................... 430/313, 312, 314
    See application file for complete search history.

(56) References Cited

U.S. PATENT DOCUMENTS

| 6,063,688 A | 5/2000 | Doyle et al. |
| 6,475,891 B2 | 11/2002 | Moon |
| 6,596,609 B2 | 7/2003 | Cheng et al. |
| 2006/0194429 A1 | 8/2006 | Hashimoto |
| 2006/0234165 A1 | 10/2006 | Kamigaki |
| 2007/0003881 A1 | 1/2007 | Ito |

FOREIGN PATENT DOCUMENTS

JP    2006-186104    7/2006

*Primary Examiner* — Daborah Chacko Davis
(74) *Attorney, Agent, or Firm* — Finnegan, Henderson, Farabow, Garrett & Dunner, LLP

(57) ABSTRACT

A manufacturing method includes forming a stacked film including first/second/third layers on a substrate, forming a first resist pattern on the stacked film, forming a first film pattern by etching the first layer through the first resist pattern, removing the first resist pattern, partially covering the first film pattern with a second resist pattern, slimming the first film pattern exposed from the second resist pattern, forming a second film pattern by etching the second layer exposed from the first layer through the first film pattern, partially covering the second film pattern with a third resist pattern, removing the first film pattern exposed from the third resist pattern, forming sidewall spacers to the second film pattern and remained second layer, removing the remained second layer portion, followed by etching the third layer through the second film pattern and sidewall spacers to form a third film pattern.

13 Claims, 12 Drawing Sheets

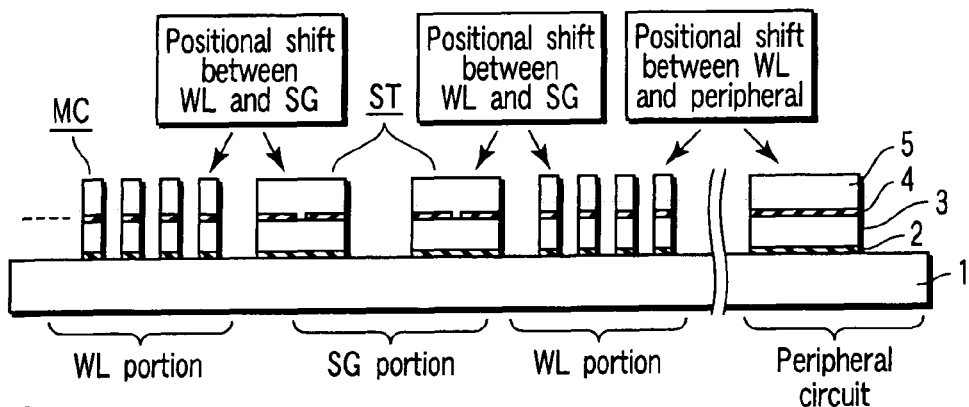
F I G. 2
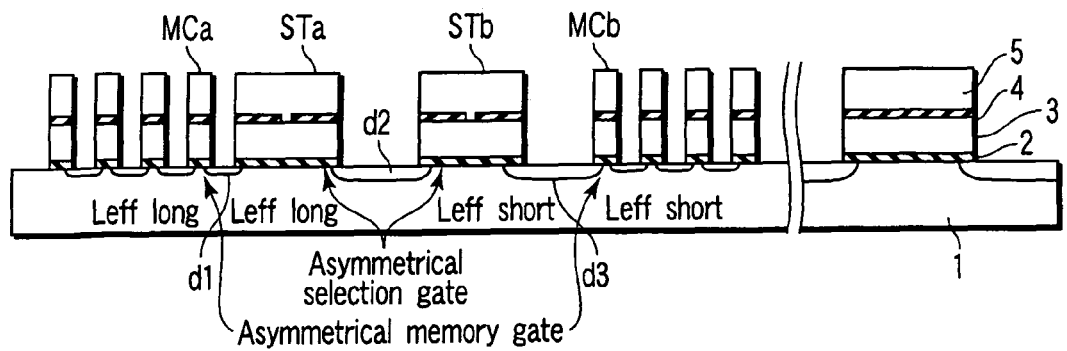
F I G. 3
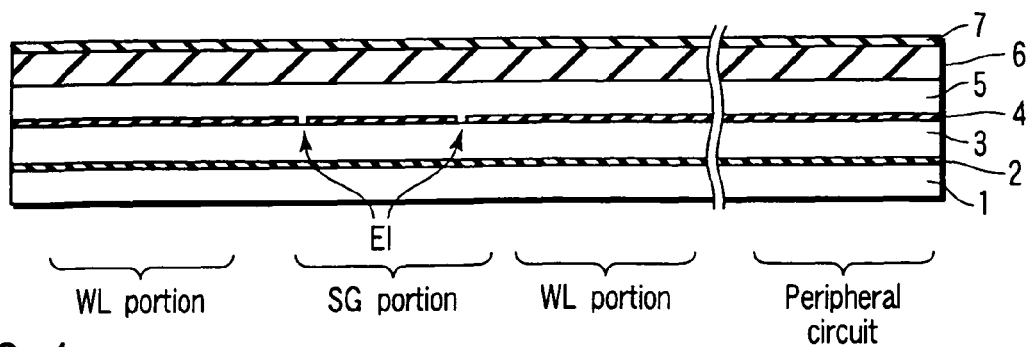
F I G. 4

Resist pattern (Fig.5)

Hard mask slimming (Fig.8)

Sidewall spacer forming (Fig.14)

Stacked gate forming (Fig.17)

MANUFACTURING METHOD OF SEMICONDUCTOR DEVICE

CROSS-REFERENCE TO RELATED APPLICATIONS

This application is a division of application Ser. No. 11/727,537, filed Mar. 27, 2007 now U.S. Pat. No. 8,158,333, and is based upon and claims the benefit of priority from prior Japanese Patent Application No. 2006-108940, filed Apr. 11, 2006, the entire contents of all of which are incorporated herein by reference.

BACKGROUND OF THE INVENTION

1. Field of the Invention

The present invention relates to a manufacturing method of a semiconductor device. In particular, the present invention relates to a method of accurately forming a micropattern using a pattern forming process using sidewall spacers.

2. Description of the Related Art

Advances in the scaling down of the pattern dimensions of semiconductor integrated circuits have accelerated remarkably. This accelerated scaling down depends on a photolithography technique, and this is expected to continue in future. The relationship between a pattern size (HP) expressed by half pitch and wavelength ($\lambda$) and lens numerical aperture (NA) used for an exposure (photolithography?) system realizing it is expressed by the following Rayleigh equation.

$$HP = k_1 * \lambda / NA$$

If the pattern size is determined to meet market requirements (cost, device performance), the factor $k_1$ included in the foregoing equation is a value showing the difficulty of lithography technique satisfying the requirements. (In this case, when the factor k1 is small, lithography is difficult.)

In general, the resolution limit of the pattern dimension using lithography is $k_1 = 0.25$. If the factor $k_1$ is less than 0.275, pattern forming using lithography becomes extremely difficult. According to the lithography in a range $k_1 < 0.275$, two-beam coherence occurs. This depends on strong off-axis illumination. According to the strong off-axis illumination, lights passing through two points only on the outermost periphery of a pupil plane are imaged on a wafer. Illumination diagram generating the two-beam coherence is a so-called dipole. Under the condition of the strong off-axis illumination, a resolution performance of patterns other than the target minimum pattern pitch becomes extremely worse. For this reason, strong off-axis illumination such as dipole illumination is often used together with double exposure technique.

According to the double exposure, an LSI pattern is formed in the following manner. Specifically, patterns having the minimum pattern pitch are formed using the dipole illumination. Patterns other than the minimum pitch are formed using weak off-axis illumination such as annular illumination. The foregoing double exposure technique is readily applied to memory devices rather than logic devices. This is because the pattern random characteristic is strong in the logic devices. On the other hand, the minimum pattern pitch is limited to memory cell only in the memory devices. In this case, the memory cell is formed using strong off-axis illumination such as dipole illumination. Patterns other than the memory cell are formed using weak off-axis illumination technique such as annular illumination.

However, the scaling down of semiconductor devices requires a pattern dimension less than the foregoing factor, that is, $k_1 < 0.2.5$. In a range of $k_1 < 0.25$, the micropattern pitch more than the minimum pattern pitch formable using lithography is required. To give one example of the foregoing method, there has been known a pattern forming process using sidewall spacers (e.g., see U.S. Pat. No. 6,063,688). As shown in FIG. 1 to FIG. 8 of the foregoing USP Publication, a resist pattern is formed on a first film used as a dummy pattern after via a lithography process. Then, using the resist pattern as a mask, the first film is etched to form a dummy pattern, and thereafter, the resist is removed. A sidewall material, that is, second film is deposited on the dummy pattern. Thereafter, the second film is etched using RIE, and thereby, sidewall spacers are formed at the sidewalls of the dummy pattern. The dummy pattern is removed, and thereafter, a target film is etched using the sidewall spacers as a mask. In this case, a hard mask is selected as the target film, and then, the hard mask is slimmed (line width is reduced), and thereby, a finer micropattern is formable. Finally, the sidewall spacers are removed, and then, the process using sidewall spacers is completed. If the hard mask is used, the front-end film is etched, and thereafter, the hard mask is removed.

The following points are given as the features of the process using sidewall spacers.

1) The pitch of a pattern formed using lithography is twice as may the design pitch. In other words, pattern forming is possible using an exposure system before two or three generation.

2) The design pattern and the lithography target pattern (dummy pattern) are different.

3) Patterns having the same pattern size are formed on the entire surface,

4) Closed loop pattern is formed.

5) Dimensional accuracy is determined by the film thickness only of the sidewall spacer; therefore, dimensional controllability is high.

6) Line edge roughness is small.

Integrated circuit patterns are formed of various line width patterns in addition to the minimum line width. For this reason, the foregoing point 3) is given as a demerit to form a complicated integrated circuit pattern. Various proposals have been made as a process using the pattern forming process using sidewall spacers (e.g., see U.S. Pat. No. 6,475,891). According to process, a pattern size having the minimum line width is formed, and patterns having a size other than the minimum line width are formed.

However, according to these proposals, the following problem arises. Specifically, the patterns having the minimum line width and other patterns must be divided, and then, lithography is carried out using independent mask (so-called twice exposure process). For this reason, misalignment occurs between the minimum line width pattern and other patterns. Thus, a design must be made so that the misalignment does not influence devices. In order to achieve this, there is a need to secure a sufficient distance (alignment margin). The alignment margin intactly gives an influence to the chip size of device, and as a result, an unnecessarily large chip is given. Therefore, this process is carried out at high cost.

As described above, the pattern forming process using sidewall spacers has various advantages. On the other hand, patterns having the pattern size are formed on the entire surface. If patterns having various sizes are mixed and formed, exposure must be carried out every size. In this case, considering the misalignment, margin needs to be taken in a pattern design. This is a factor of make large the chip size. Moreover, if misalignment occurs in the pattern that the same transistors are repeatedly formed, the following problem arises. Specifically, unbalance occurs in characteristics between formed transistors. As a result, characteristic failure is a factor of reducing the yield.

Accordingly, it is desired to realize the following integrated circuit pattern forming method. According to the method, it is possible to prevent characteristic unbalance based on the misalignment and to prevent the chip area from being wastefully made large.

BRIEF SUMMARY OF THE INVENTION

According to a first aspect of the invention, there is provided a method of manufacturing a semiconductor device, which includes:

forming a stacked film including a first layer/a second layer/a third layer on a substrate;

forming a first resist pattern on the stacked film;

forming a first film pattern by etching the uppermost layer of the stacked film, which is the first layer, using the first resist pattern as a mask;

after removing the first resist pattern, partially covering the first film pattern with a second resist pattern;

slimming the first film pattern on an area exposed from the second resist pattern using etching;

after removing the second resist pattern, forming a second film pattern comprised of the first layer and the second layer, by etching the second layer exposed from the first layer using the first film pattern as a mask;

partially covering the second film pattern with a third resist pattern;

removing the first film pattern on an area exposed from the third resist pattern using etching, so that the second layer under the first film pattern remains;

after removing the third resist pattern, forming sidewall spacers at respective sidewalls of the second film pattern including the first layer stacked on the second layer and the remained second layer;

after forming the sidewall spacers, removing the remained second layer;

etching the third layer using the second film pattern including the first layer stacked on the second layer and the sidewall spacers as masks to form a third film pattern; and after forming the third film pattern, removing the second film pattern and the sidewall spacers to leave the third film pattern.

According to a second aspect of the invention, there is provided a method of manufacturing a semiconductor device, which includes:

forming a stacked film including a first layer/a second layer/a third layer on a substrate;

forming a first resist pattern on the stacked film;

forming a first film pattern, by etching the uppermost layer of the stacked film, which is the first layer, using the first resist pattern as a mask;

after removing the first resist pattern, slimming the first film pattern;

etching the second layer under the first layer using the first film pattern as a mask;

forming a second film pattern including the first layer and the second layer;

forming a second resist pattern partially covering the second film pattern;

removing the first layer of the second film pattern on an area exposed from the second resist pattern using etching so that the second layer under the first layer remains;

after removing the second resist pattern, forming sidewall spacers at respective sidewalls of the second film pattern including the first layer stacked on the second layer and the remained second layer;

after forming the sidewall spacers, removing the remained second layer;

etching the third layer using the second film pattern including the first layer stacked on the second layer and the sidewall spacers as masks form a third film pattern; and after forming the third film pattern, removing the second film pattern and the sidewall spacer to leave the third film pattern.

According to a third aspect of the invention, there is provided a method of manufacturing a semiconductor device, which includes:

forming a stacked film including a first layer/a second layer/a third layer on a substrate;

forming a first resist pattern on the stacked film;

slimming the first resist pattern;

forming a first film pattern by etching the uppermost layer of the stacked film, which is the first layer, using the slimmed first resist pattern as a mask;

forming a second film pattern by etching the second layer using the first layer as a mask, the second film pattern including a first layer portion and a second layer portion;

forming sidewall spacers at respective sidewalls of the second film pattern;

after forming the sidewall spacers, forming a second resist pattern partially covering the first film pattern;

after forming the second resist pattern removing the second film pattern exposed from the second resist pattern;

after removing the second resist pattern, etching the third layer using the second film pattern and the sidewall spacers to form a third film pattern; and after forming the third film pattern, removing the second film pattern and the sidewall spacers so that the third film pattern remains.

BRIEF DESCRIPTION OF THE SEVERAL VIEWS OF THE DRAWING

FIG. 2 is a cross-sectional view schematically showing a NAND flash memory to explain misalignment in twice exposure;

FIG. 3 is a cross-sectional view schematically showing a NAND flash memory to explain a characteristic change resulting from the foregoing misalignment;

FIGS. 4 to 17 are cross-sectional views to stepwise explain the process of manufacturing a NAND flash memory according to a first embodiment of the present invention;

DETAILED DESCRIPTION OF THE INVENTION

Figure 1:
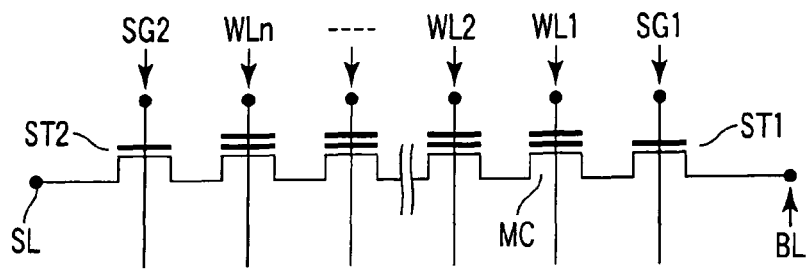
FIG. 1 is an equivalent circuit diagram of a general NAND flash memory.

Prior to the description of various embodiment of the present invention, the problem of the pattern forming process using sidewall spacers in twice exposure process will be detailedly explained below. In this case, a NAND flash memory is given as an example. FIG. 1 is an equivalent circuit diagram corresponding to one string of the NAND flash memory. According to the circuit configuration (structure), serial-connected several memory cells MC are provided between selection transistors ST1 and ST2. Selection transistors ST1 and ST2 have gates connected with selection gate lines SG1 and SG2. The memory cells MC have control gates connected with word lines (control gate line) WL1 to WLn. One of source/drain of the selection transistor ST1 is connected to a bit line BL. One of source/drain of the selection transistor ST2 is connected to a source line SL.

In an actual memory IC, the foregoing several NAND strings are arrayed like a matrix in the memory cell. A peripheral circuit adjacent to the memory cell is provided with a memory cell control circuit. FIG. 2 is a cross-sectional view partially showing the NAND flash memory. Specifically, two NAND strings (facing end portions only are shown) are arrayed so that end selection transistors faces each other. The gate electrode of one transistor of the peripheral circuit is shown at the right side of the broken line. The gate structure of these transistors has the same layer configuration as already known. Specifically, the following films 2 to 5 are stacked on a semiconductor substrate 1. One is a first gate insulating film 2, and another is a first polysilicon gate film (floating gate) 3. Another is a second gate insulating film (intergate insulating film 4, and another is a second polysilicon gate film (control gate) 5. The foregoing stacked film is etched and separated off using photolithography.

As described above, when the stacked gate is formed using the pattern forming process using sidewall spacers, the gate having the same pattern size is merely formed. For this reason, the lithography process must be independently divided to form memory cell VC forming the word line (WL portion), selection transistor ST and peripheral transistor. In other words, exposure process is carried out at two times; for this reason, misalignment margin must be taken in photolithography. The positional shift (misalignment) occurs between the WL portion and the selection gate (SG) and between the WL portion and the peripheral portion.

The foregoing problem is very serious in the case where the pattern forming process using sidewall spacers is applied to the following device. The device has a pattern such that the line width is different between WL and SG portions in a memory cell array, like the gate layer of the NAND flash memory. This requires the following consideration. Namely, the misalignment margin must be secured in the memory cell array (usually 60 to 80% area occupancy) having high area occupancy in the chip. This is a factor of increasing the area of the memory cell; as a result, the chip size is made large.

Here, the case where the misalignment margin is not secured in the memory cell is considered. As seen from FIG. 3, there are shown neighboring selection gates STa and STb (two gates are formed using the same mask; therefore, no positional shift occurs). The case where the following positional shift (misalignment) occurs is given. Specifically, the distance between a selection gate STa and a memory cell MCa adjacent thereto is less than a predetermined distance. Moreover, the distance between a selection gate STb and a memory cell MCb adjacent thereto is wider than the predetermined distance. Using stacked gate ST and MC as a mask, source/drain diffusion layers d1, d2 and d3 are formed via ion implantation. The wider the distance between masks is, the deeper ions are implanted. Therefore, the depth of the diffusion layer has a relation of d1<d2, d3. The depth of the diffusion layer is proportional to the diffusion length to the lower potion of the stacked gate. Comparison is made between the effective channel length Leff of the memory cell MCa of the WL portion and the effective channel length Leff of the memory cell MCb. As a result, the relation Leff (MCa) >Leff (MCb) is given. On the other hand, the effective channel length Leff of selection transistors STa and STb has a relation of Leff (STa)>Leff (STb).

The above is the case where the effective channel length only is considered. The following points are given as a problem of the twice exposure process.

1) The characteristic (Vth, Ion, Ioff) of right and left selection transistors (STa, STb) is asymmetrical.

2) The characteristic (Vth, Ion, Ioff) of right and left memory cell (MCa, MCb) is asymmetrical.

3) The area of the cell increases to solve the foregoing problems (i.e., the distance between SG and WL must be widely taken.)

4) In order to align the transistor characteristic of the MCa with other MCs, ion implantation process must be tuned up. (This requires a complicated process such as two-time ion* implantations.)

5) The area increase to solve the problem of the misalignment of the WL portion with the peripheral portion.

According to the points 1) and 2) of the foregoing problems, the effective channel length Leff of the MCb is small, and the threshold voltage of the MCb steps down. As a result, excess write cell is given. This is a factor of stepping up the threshold voltage in a read operation. For this reason, a NAND string does not turn on; as a result, readout is not carried out. In order to solve this problem, the complicated process described in the foregoing point 4) is required. Thus, high-cost process must be carried out. The present invention provides the method of solving the foregoing problems.

Various embodiments of the present invention will be hereinafter described with reference to the accompanying drawings.

(First Embodiment)

FIGS. 4 to 17 show a process flow of a semiconductor integrated circuit device according to a first embodiment of the present invention. According to the first embodiment, the process flow will be explained giving a NAND flash memory as the device. First, the following layers are stacked on a substrate, that is, silicon substrate 1. One is a tunnel oxide film 2 given as a first layer, and another is a polysilicon layer 3 functioning as a floating gate. Another is a high dielectric layer 4 used as an intergate insulating film, and another is a second polysilicon layer functioning as a control gate. Further, silicon oxide layer (second layer) 6 used as a sacrificial film and hard mask layer. (third layer) are deposited (FIG. 4).

Figure 5:
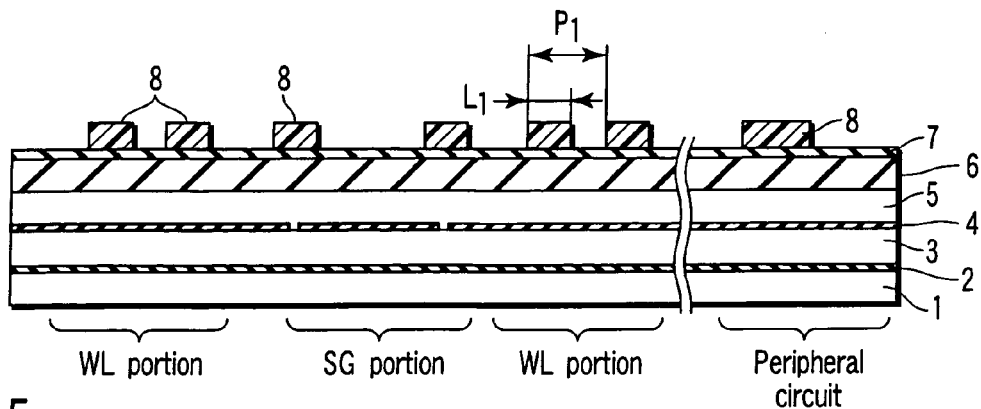

In this case, Al2O3 is used as the high dielectric layer 4, and a borosilicate glass (BSG) layer is used as the silicon oxide layer 6. A silicon nitride layer (SiN layer) is used as the hard mask layer 7. The silicon nitride layer takes etching selectivity with respect to the BSG layer. In FIG. 4, EI shows an opening used for electric conduction between floating gate 3 and control gate 5 in portion functioning as a selection gate (SG) portion later. The EI is previously formed using lithography process and etching process WL (word line) portion, SG portion and peripheral circuit are formed with a resist pattern (first mask pattern) via a first lithography process (FIG. 5). In the WL portion, a pattern pitch P1 of the resist pattern and the rest dimension L1 is twice as many as pitch P2 of final memory cell (MC) transistor pattern (or WL) and transistor gate length L2 (see FIG. 17 described later). Specifically, if a transistor having a 55 nm gate length is required in the WL portion, the resist width of the WL portion is about 110 nm. The resist pattern pitch is about 220 nm. In the SG portion, the resist pattern is about 1.5 to 4 times as many as WL transistor dimension. In the peripheral circuit, the resist pattern is random dimension in accordance with a circuit pattern. Moreover, the resist has a film thickness of about 0.200 to 400 nm.

Figure 6:
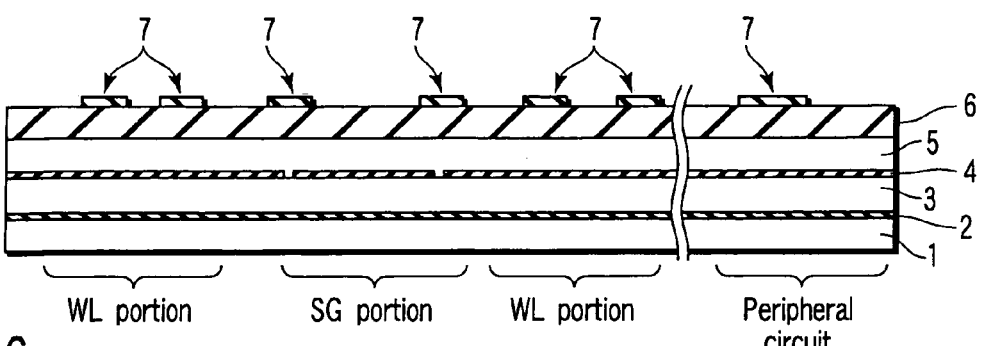

The front-end hard mask layer 7 is etched using the resist pattern 8 to form a pattern (second mask pattern) of the hard mask layer 7 (FIG. 6). In general, anisotropic etching (RIE) is used as the etching process. FIG. 6 shows a state that the hard mask 7 is etched, and thereafter, the resist 8 is removed. As the resist removal process, ashing process ($O_2$ asher) under oxygen atmosphere is generally given.

Figure 7:
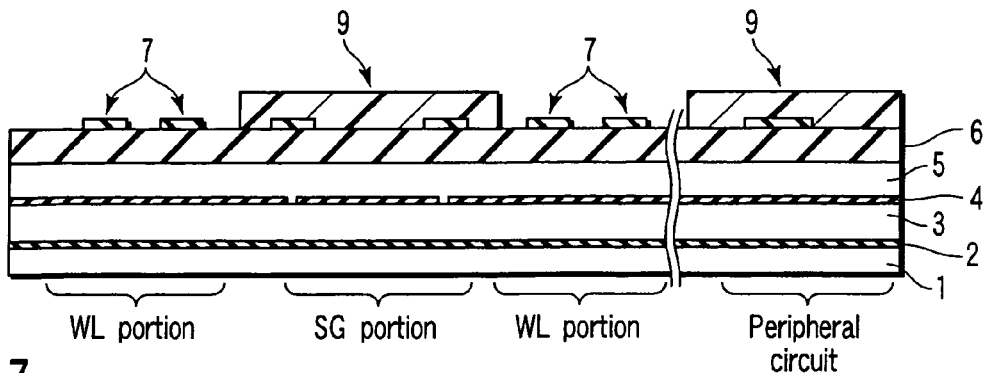
Figure 8:
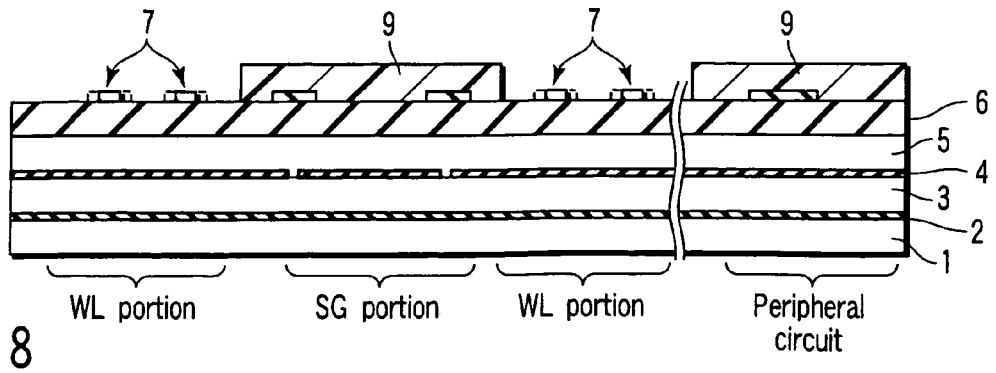

According to a second lithography process, the SG portion and the hard mask pattern of the peripheral circuit are covered with a resist 9 to expose hard mask pattern only of the WL portion (FIG. 7). In this case, the film thickness of the resist 9 is thicker than that of the resist 8 in the first lithography process. The exposed hard mask pattern 7 is slimmed via an etching process (FIG. 8).

In this case; as the etching process, isotropic etching such as CDE process or wet process is used in general. The process is determined depending on hard mask material and slimming controllability. For example, if an SiN film is used as the hard mask; wet etching by hot phosphoric acid is given. The dimension slimmed according to slimming is about half (per side) of the final gate length in the WL portion. Specifically, if the dimension of a 55-nm WL transistor is required, the slimming dimension is about 27.5 nm per side.

Figure 9:
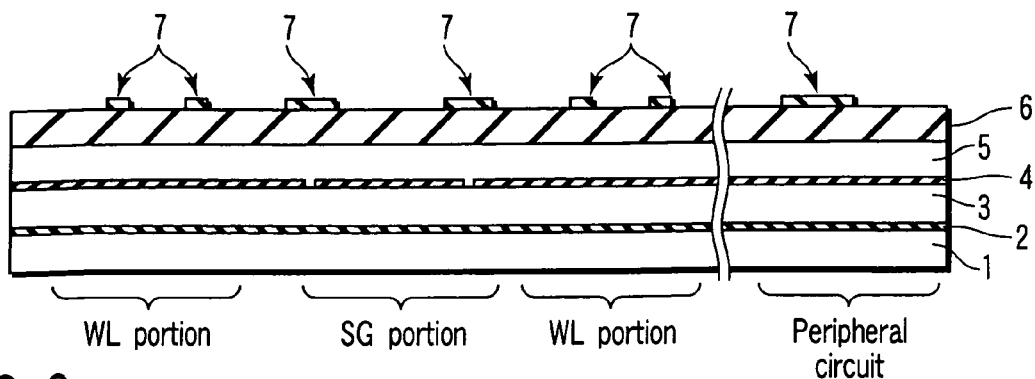

The slimming process of the hard mask of the WL portion is completed, and thereafter, the resist pattern 9 of SG portion and peripheral circuit is removed (FIG. 9). As the resist removal process, ashing process at oxygen atmosphere ($O_2$ asher) is given in general.

Figure 10:
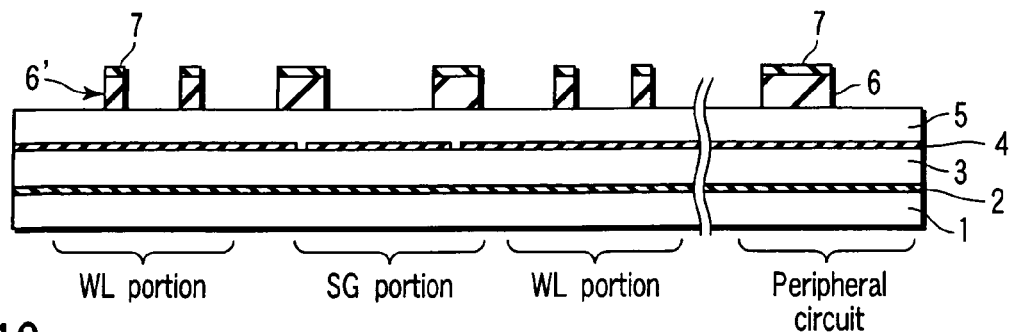

Then, the front-end BSG mask is etched using the hard mask pattern 7 (FIG. 10). Anisotropic etching (RIE) is generally given as the etching process. In this case, the BSG pattern 6 having the same dimension as the resist pattern 8 formed via the first lithography process is formed in SG portion and peripheral circuit. A BSG pattern 6' having about half the dimension of the resist pattern 8 formed via the first lithography is formed in the WL portion. In etching the BSG layer, etching is carried out under the condition that the hard mask 7 remains on the BSG layer 6. (i.e., under etching condition that the etching selectivity of the BSG layer 6 is higher as compared with the hard mask 7.)

Figure 11:
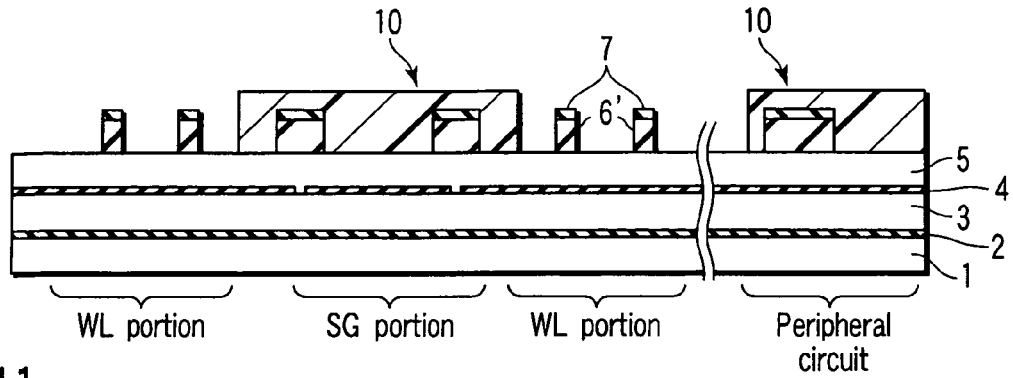

According to a third lithography process, the stacked pattern comprising hard mask layer 7/BSG layer 6 is covered with a resist (third mask pattern) 10 in SG portion and peripheral circuit. In this way, the stacked pattern only comprising hard mask layer 7/BSG layer 6' is exposed in the WL portion (FIG. 11). In this case, the film thickness of the resist 10 is thicker than the resist 8 in the first lithography process. The third mask pattern is formable using the same exposure mask as the second mask pattern.

Figure 12:
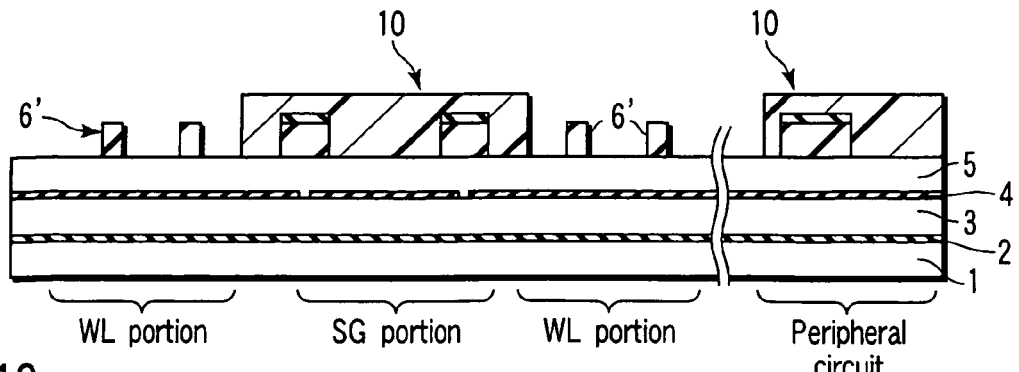

The hard mask 7 only on the stacked pattern comprising hard mask layer 7/BSG layer 6' is removed (etched) using an etching process (FIG. 12). In this case, an isotropic etching process such as CDE process and wet process is used as the etching process in general. The process is determined depending on the hard mask material, etc. For example, if a SiN film is selected as the hard mask; wet etching using hot phosphoric acid is given.

Figure 13:
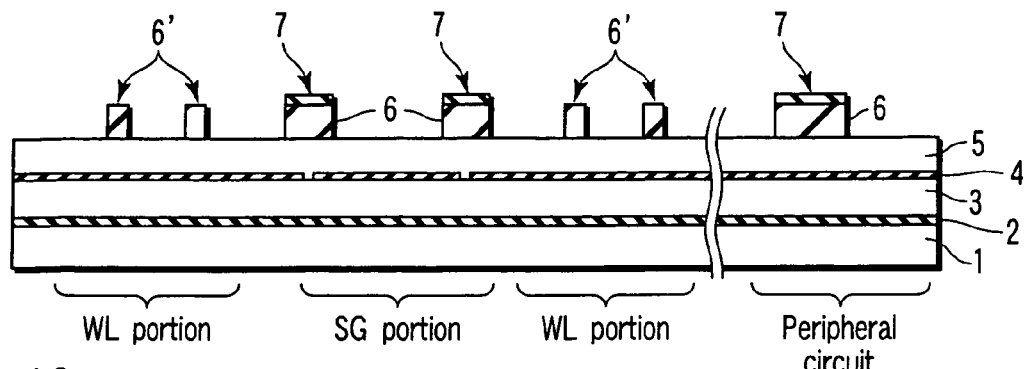

The hard mask of the WL portion is removed, and thereafter, the resist pattern 10 is removed (FIG. 13). In general, an ashing process at oxygen atmosphere ($O_2$ asher) is given as the resist removal process. Via the foregoing processes, the WL portion is formed with the BSG pattern 6' with a pitch twice as many as the final transistor pattern pitch. Moreover, the SG portion and the peripheral circuit are each formed with the stacked pattern comprising hard mask layer 7/BSG 6

Figure 14:
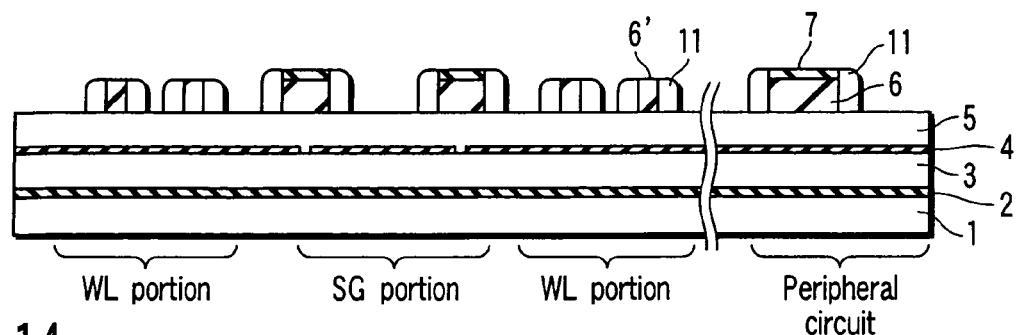

The sidewalls of these patterns are each formed with sidewall spacers (fourth film) 11 (FIG. 14). The details of the method of forming the sidewall spacers are omitted. In general, insulating films such as silicon oxide film and silicon nitride film used as the sidewall material are deposited on the pattern using a CVD process. The pattern is left on the sidewall only using etching such as RIE.

Figure 15:
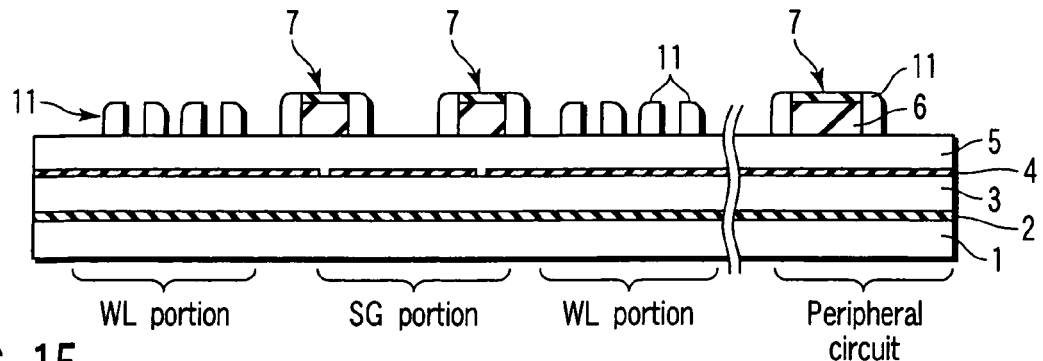

The dimension of the sidewall spacer 11 corresponds to the deposited film thickness of the sidewall material. In this case, the dimension of the sidewall spacer 11 is set to have the same value as the WL dimension of the present generation NAND flash memory. For example, if a 55 nm WL transistor dimension is required, the deposition thickness is set as 55 nm. The dimension of the sidewall spacer substantially corresponds to the deposition thickness of the sidewall film; therefore, dimensional controllability is very high. Then, the BSG film 6' exposed, on the surface is removed using etching. A VPC process is generally known as the etching. In this case, the BSG film is removed in the WL portion only. On the other hand, the BSG film 6 of the SG portion and the peripheral circuit is covered with the hard mask 7; therefore, the BSG film 6 is not removed (FIG. 15).

Figure 16:
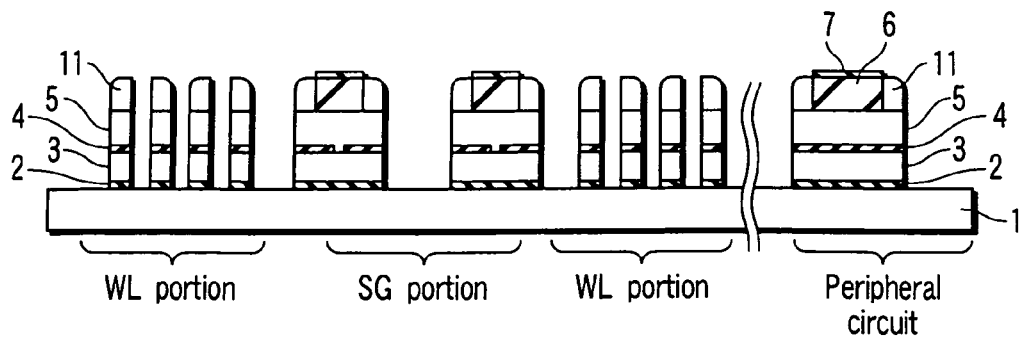

The front-end, that is, the gate structure (tunnel oxide film 2/first polysilicon film 3/$Al_2O_3$ film 4/second polysilicon film 5) of the NAND flash memory is formed in the following manner. In the WL portion, etching is carried out using the sidewall spacer 11 as a mask. In the SG portion and the peripheral circuit, etching is carried out using sidewall spacer 11, hard mask pattern 7 and BSG film 6 as a mask (FIG. 16).

Figure 17:
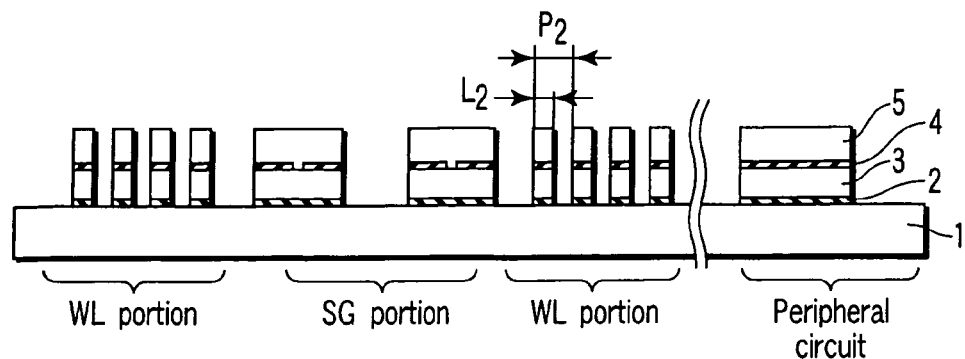

Finally, the foregoing sidewall spacer 11 used as a mask, hard mask pattern and BSG film 6 are removed using etching (FIG. 17). A pattern having no misalignment is formed between SG portion and WL portion and between peripheral circuit and WL portion. The foregoing process is employed, and thereby, there is no need of taking misalignment margin between WL portion and SG portion or between WL portion and peripheral circuit. Therefore, it is possible to manufacture a NAND flash memory including memory cells each having uniform characteristic.

(Second Embodiment)

According to the second embodiment, a NAND flash memory is given as an example, and another process will be explained below. The same process as FIGS. 4 and 5 of the first embodiment is carried out with respect to a silicon substrate (target substrate) 1. Specifically, in the WL portion, the pattern pitch and resist dimension of a resist pattern (first mask pattern) 8 is about twice as many as the pitch and transistor dimension (gate length) of the final WL transistor pattern. If the dimension of a 55 nm WL transistor is required, the resist dimension of the WL portion is about 110 nm, and the resist pattern pitch is about 220 nm. In the SG portion, the resist pattern 8 is about 1.5 to 4 times as many as the WL transistor dimension. The resist pattern 8 of the peripheral circuit has random dimensional pattern in accordance with a circuit pattern. Moreover, the film thickness of the resist is about 200 to 400 nm.

Figure 18:
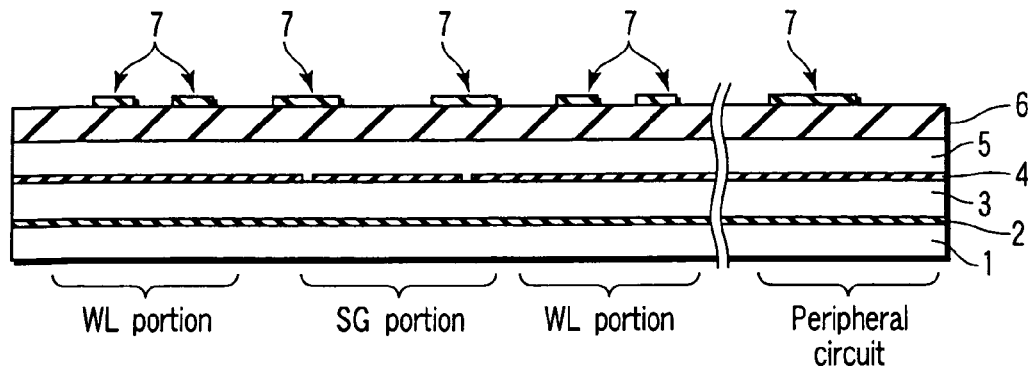
FIGS. 18 to 27 are cross-sectional views to stepwise explain the process of manufacturing a NAND flash memory according to a second embodiment of the present invention.

As illustrated in FIG. 18, the front-end, that is, hard mask material (third film) is etched using the resist pattern 8 to form a pattern of the hard mask 7. As the etching process, anisotropic etching (RIE) is given in general. FIG. 18 shows a state that the hard mask is etched, and thereafter, the resist is removed. As the resist removal process, ashing process at oxygen atmosphere ($O_2$ asher) is used in general.

Figure 19:
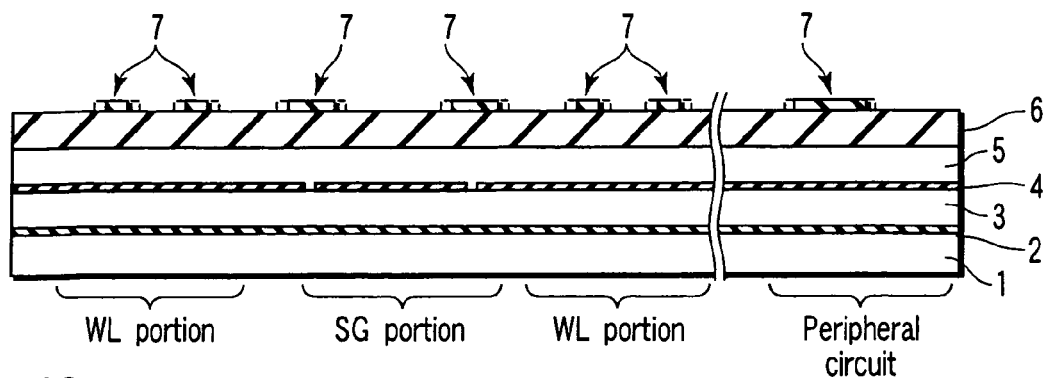

Then, the exposed hard mask pattern 7 is slimmed using etching process (FIG. 19). In this case, isotropic process such as CDE process and wet process are generally used as the etching process. The process is determined depending on hard mask material and slimming controllability. For example, if a SiN film is selected as the hard mask; wet etching using hot phosphoric acid is used. The thickness slimmed according to slimming is about half of the final WL transistor dimension (per side). Specifically, if a 55 nm WL transistor dimension is required, the slimmed thickness is about 27.5 nm per side.

Figure 20:
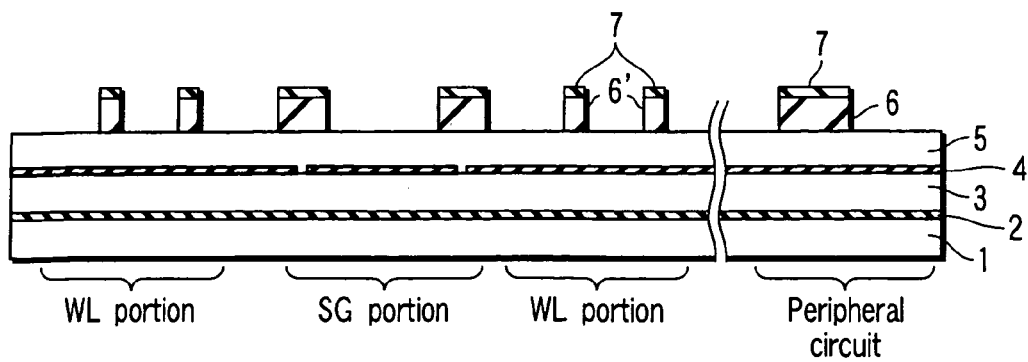

The front-end BSG layer (second layer) 6 is etched using the hard mask pattern 7 as a mask (FIG. 20). It is general that anisotropic etching (RIE) is used as the etching process. In this case, the WL portion is formed with a BSG pattern 6 having about half the dimension of the resist pattern 8 formed via the first lithography process. In etching the BSG pattern 6, etching is carried out under the condition that the hard mask remains on the BSG film. (i.e., under the etching condition that etching selectivity of the BSG film 6 is high with respect to the hard mask 7.)

Figure 21:
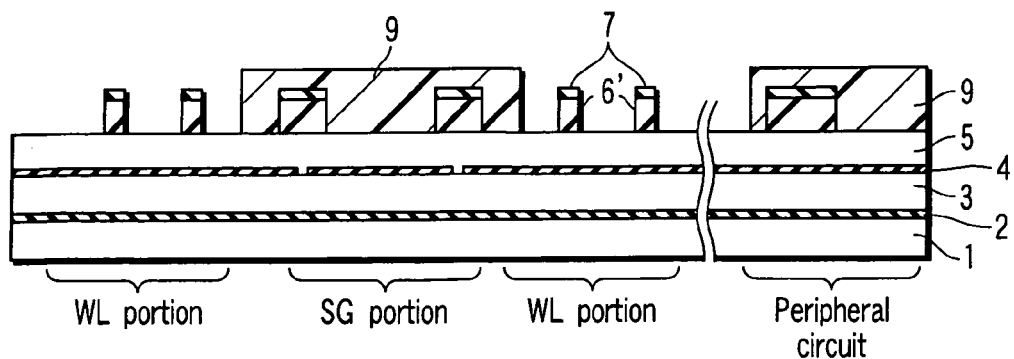

In a second lithography process, the stacked pattern comprising hard mask 7/BSG film 6 in the SG portion and the peripheral circuit is covered with a resist (second mask pattern) 9, thereby exposing the stacked pattern only comprising hard mask 7/BSG film 6' in the WL portion (FIG. 21). In this case, the film thickness of the resist 9 becomes thicker than the resist 8 formed via the first lithography process.

Figure 22:
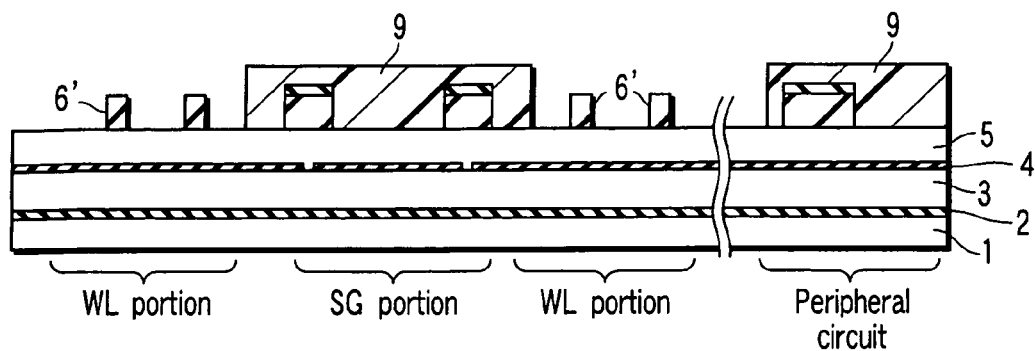
Figure 23:
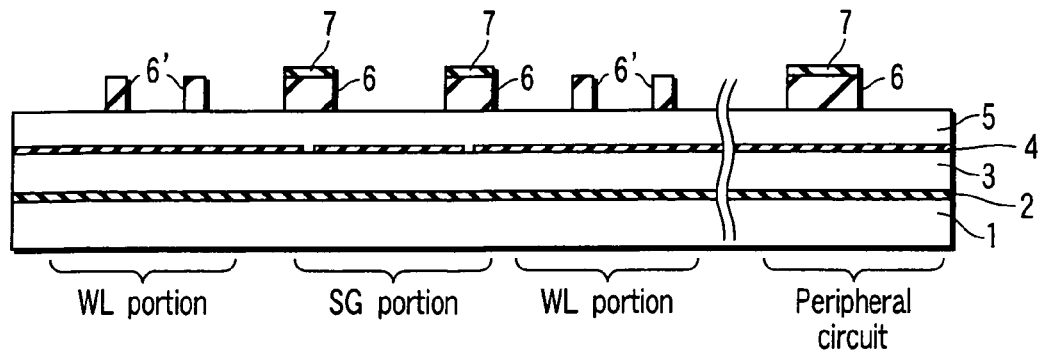

The hard mask 7 only on the exposed stacked pattern only comprising hard mask 7/BSG film 6' is removed using etching process (FIG. 22). In this case, isotropic etching such as CDE process or wet process is generally used as the etching process. The process is determined depending on the hard mask material. For example, if a SiN film is selected as the hard mask 7; wet etching using hot phosphoric acid is used. The hard mask of the WL portion is removed, and thereafter, the resist pattern is removed (FIG. 23). As the resist removal process, ashing process at oxygen atmosphere ($O_2$ asher) is used in general. Via the foregoing processes, the WL portion is formed with a BSG pattern with a pitch twice as many as the final transistor pattern pitch. Moreover, SG portion and peripheral circuit are each formed with a stacked pattern comprising hard mask 7/BSG film 6.

Figure 24:
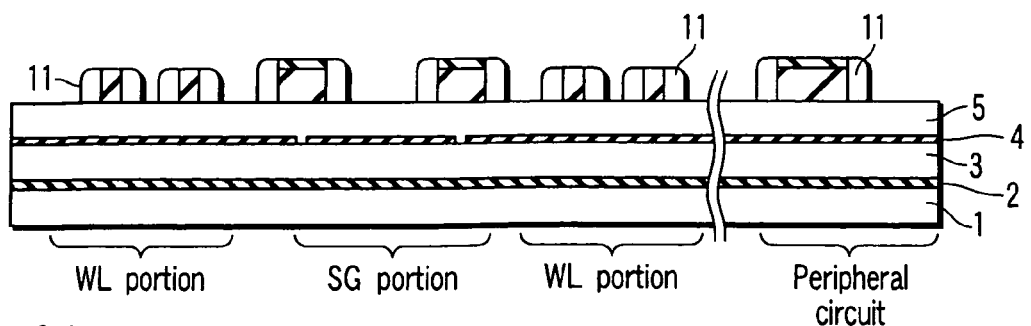
Figure 25:
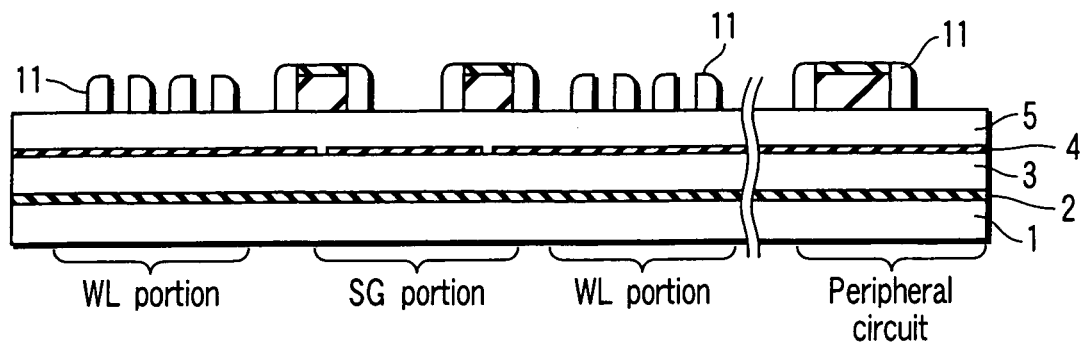

The sidewall of each pattern is formed with a sidewall spacer (fourth film) 11 (FIG. 24). The method of forming the sidewall spacer is the same as described in the first embodiment. The BSG film 6' exposed on the surface is removed using etching. In general, a VPC process has been known as the etching process. In this case, the BSG film is removed in the WL portion only. On the other hand, the BSG film 6 of the SG portion and the peripheral circuit is covered with the hard mask 7; therefore, the BSG film 6 is not removed (FIG. 25).

Figure 26:
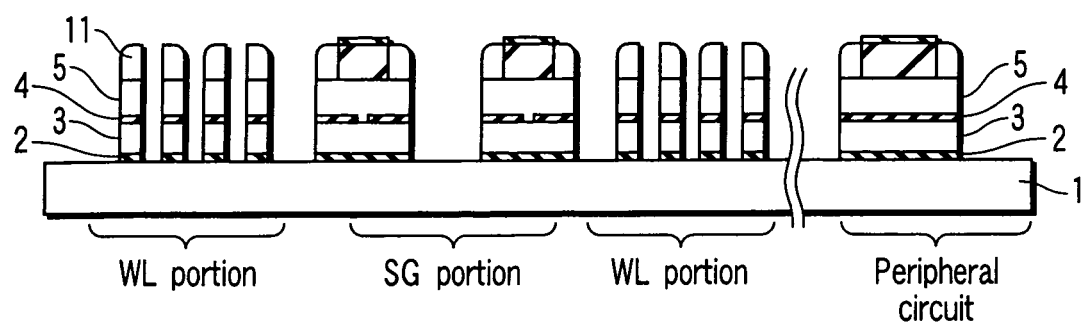
Figure 27:
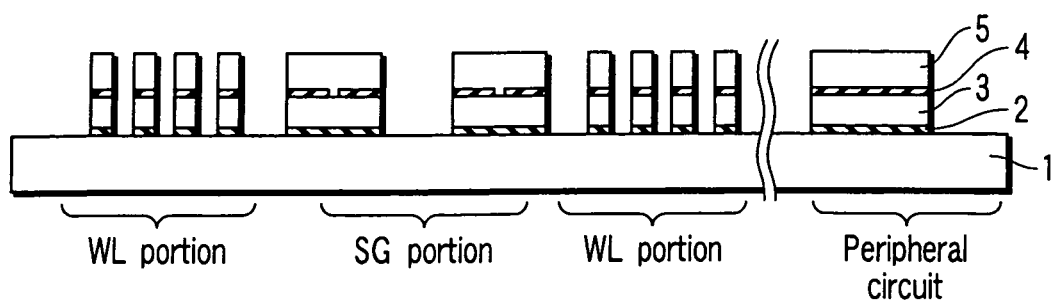

The front-end, that is, the gate structure (tunnel oxide film 2/first polysilicon film 3/$Al_2O_3$ film 4/second polysilicon film 5) of the NAND flash memory is formed in the following manner. In the WL portion, etching is carried out using the sidewall spacer 11 as a mask. In the SG portion and the peripheral circuit, etching is carried out using sidewall spacer 11, hard mask pattern 7 and BSG film 6 as a mask (FIG. 26). Finally, sidewall spacer 11, hard mask pattern 7 and BSG film 6, which are used as a mask, are removed using etching (FIG. 27). In this way, patterns having no misalignment are formed in SG portion and WL portion and in peripheral circuit and WL portion.

According to the second embodiment, the same effect is obtained using simple process as compared with the first embodiment.

Figure 28A:
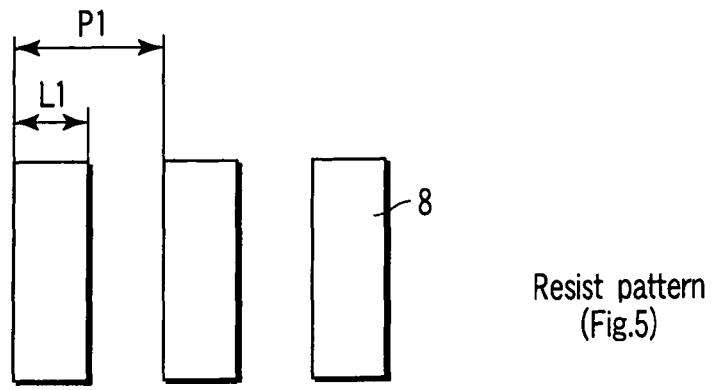
FIGS. 28A to 28D are top plan views to explain the relationship between a mask pattern and a completed gate pattern in embodiments of the present invention.
Figure 28B:
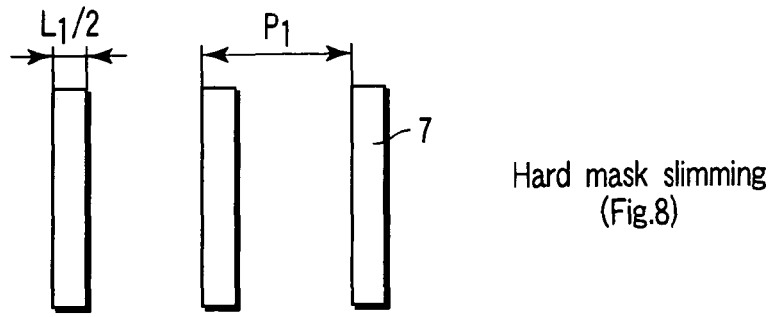
Figure 28C:
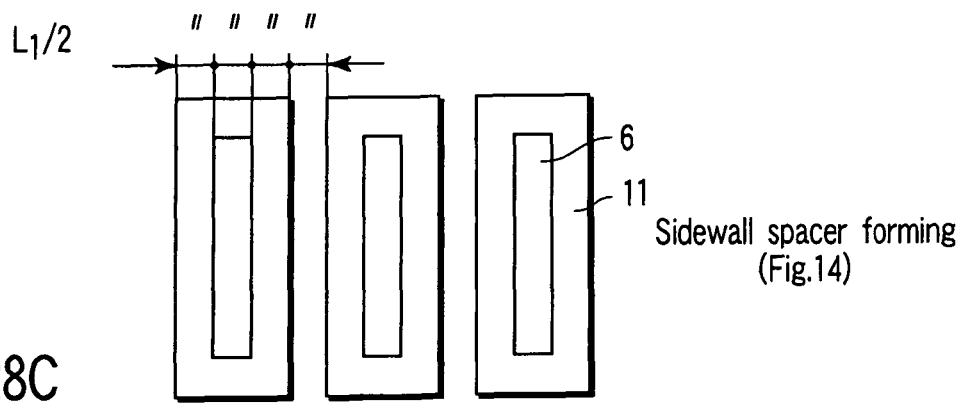
Figure 28D:
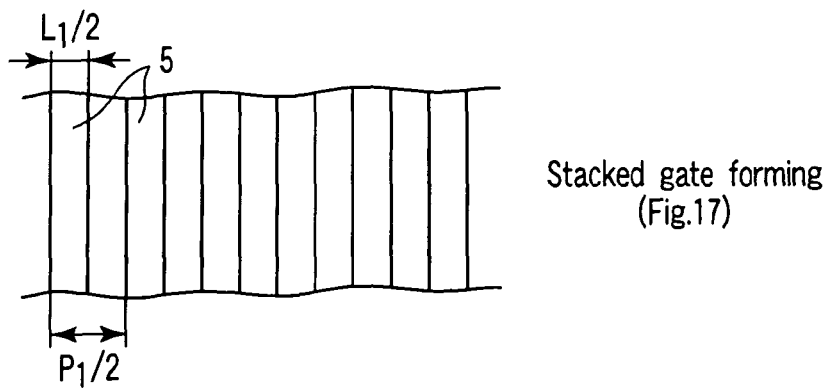

In the foregoing second embodiment, the relationship in the size between first and final forming resist patterns will be explained using top plan views. FIG. 28A is a schematic top plan view showing the resist 8 in FIG. 5. The resist 8 is formed having a width L1 and pitch P1. FIG. 28B shows a plane shape of the slimmed hard mask 7 in the WL portion of FIG. 8. The slimmed hard mask 7 has a width L1/2 and pitch P1. FIG. 28C is a top plan view showing a state that sidewall spacer 11 is formed in FIG. 14. The width of the sidewall spacer 11 and BSG film 6 and the distance between neighboring sidewalls 11 are all formed having L1/2. FIG. 28D is a top plan view showing a state that the stacked gate structure of the WL portion is formed in FIG. 17. The stacked gate width (gate length) is L2=L1/2, and the pitch is P2=P1/2.

In general, a ratio of gate length to intergate distance is often set as 1:1 in design. Preferably, the actual product is controlled in a range of P2/P1=0.4 to 0.6.

(Third Embodiment)

According to the third embodiment, still another process flow will be explained giving a NAND flash memory as an example. The same process as FIGS. 4 and 5 of the first embodiment is carried out with respect to a silicon substrate (target substrate) 1.

Figure 29:
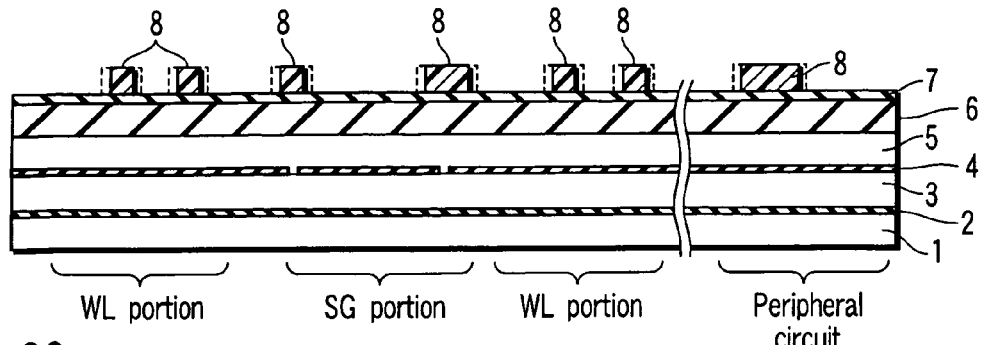
FIGS. 29 to 36 are cross-sectional views to stepwise explain the process of manufacturing a NAND flash memory according to a third embodiment of the present invention.

As depicted in FIG. 29, a resist pattern 8 is slimmed via etching process. In this case, isotropic etching such as CDE process and wet process is used as the etching process in general. Moreover, RIE over etching is usable in order to perform the foregoing slimming. There may be used the RIE over etching for etching an anti-reflection material (formed under the resist for the purpose of preventing reflection from the front end, not shown). The process is determined depending on the anti-reflection material and slimming controllability. The thickness slimmed according to slimming is about half of the final WL transistor dimension (per side). Specifically, if a 55 nm WL transistor dimension is required, the slimmed thickness is about 27.5 nm per side.

Figure 30:
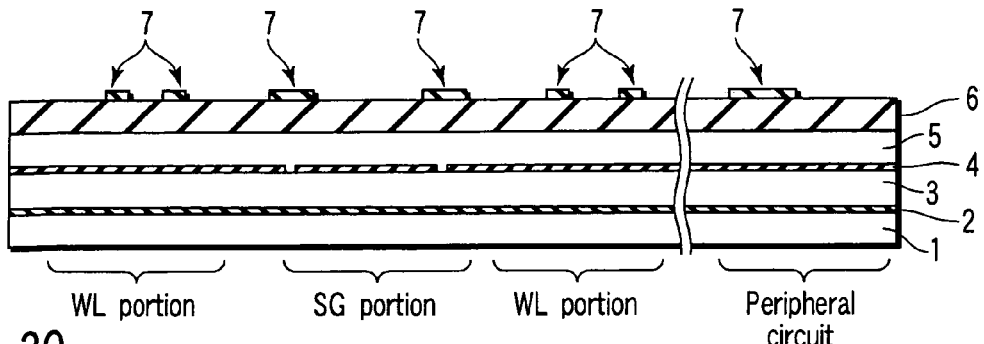

As shown in FIG. 30, a front-end hard mask material 7 is etched using the slimmed resist pattern 8 to form a hard mask pattern. As the etching process, anisotropic etching (RIE) is used in general. FIG. 30 shows a state that the hard mask is etched, and thereafter, the resist is removed. As the resist removal process, ashing process at oxygen atmosphere ($O_2$ asher) is used in general.

Figure 31:
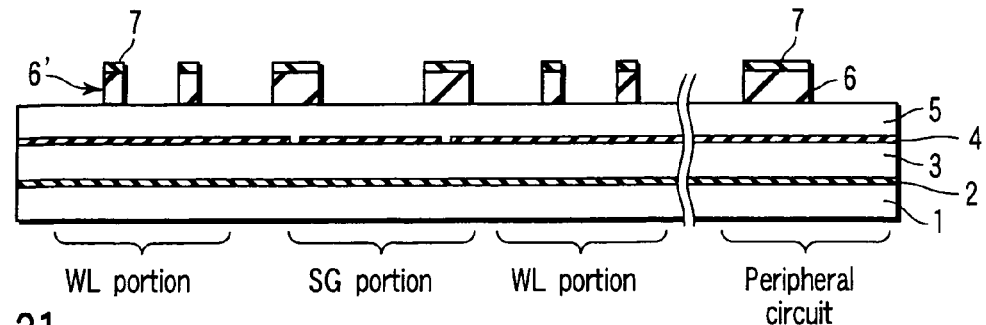

As seen from FIG. 31, a front-end, that is, BSG layer 6 is etched using the hard mask as a mask. Anisotropic etching is used as the etching process in general. In this case, the SG portion and the peripheral circuit are each formed with a BSG pattern 6 having the following dimension at the resist pattern 8 formed in the first lithography process. Namely, the BSG pattern 6 has a dimension subtracting the thickness slimmed according to slimming. The WL portion is formed with a BSG pattern 6 having a dimension of about half of the resist pattern 8 formed in the first lithography process. In etching the BSG pattern 6, etching is carried out under the condition that the hard mask remains on the BSG film. (i.e., under the etching condition that the etching selectivity of the BSG film is high as compared with the hard mask.)

Figure 32:
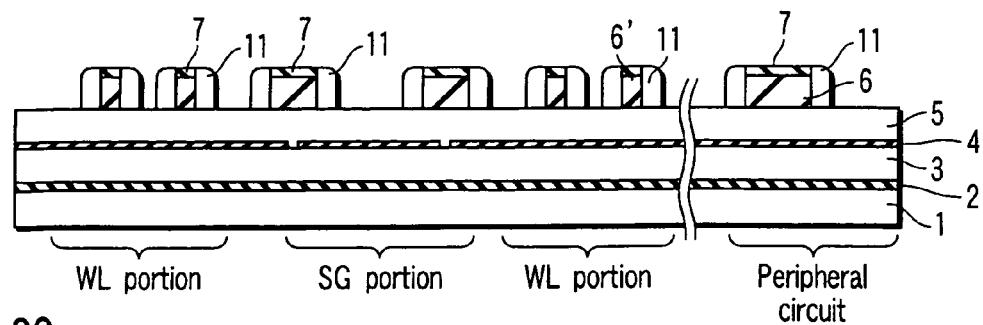

As illustrated in FIG. 32, the sidewall of the patterns is formed with sidewall spacers 11. The details of the method of forming the sidewall spacers are omitted; however, the following method is used in general. Specifically, the sidewall material, that is, an insulating film such as oxide film and nitride film is deposited using a CVD process to cover the BSG pattern 6. Then, the insulating film is left on the sidewall only of the BSG pattern 6 using etching such as RIE. The horizontal film thickness of the sidewall spacer corresponds substantially to the deposited thickness of the sidewall material. The film thickness of the sidewall spacer is set to become the same value as the WL dimension of the present generation NAND flash memory. As described above, the horizontal film thickness of the sidewall spacer corresponds substantially to the deposited thickness of the sidewall material. Therefore, dimensional controllability is extremely high.

Figure 33:
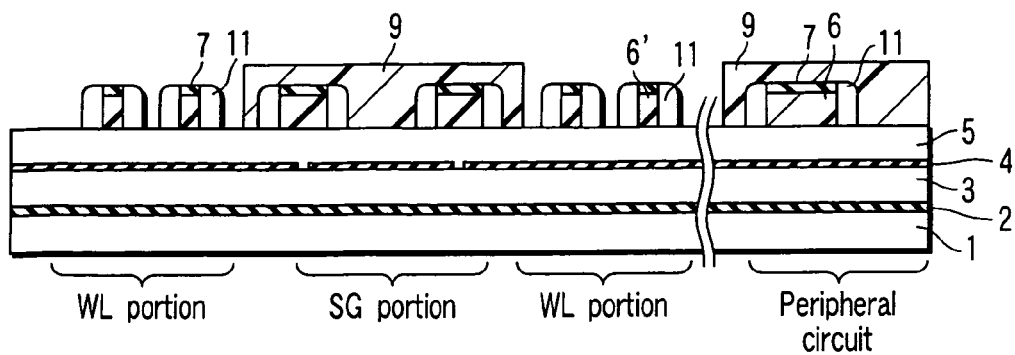

As shown in FIG. 33, in a second lithography process, an area including the hard mask patterns 7 of SG portion and peripheral circuit is covered with a resist 9, thereby exposing only area including the hard mask pattern 7 of the WL portion. In this case, the film thickness of the resist 9 is formed thicker than that of the resist 8 in the first lithography process in general.

Figure 34:
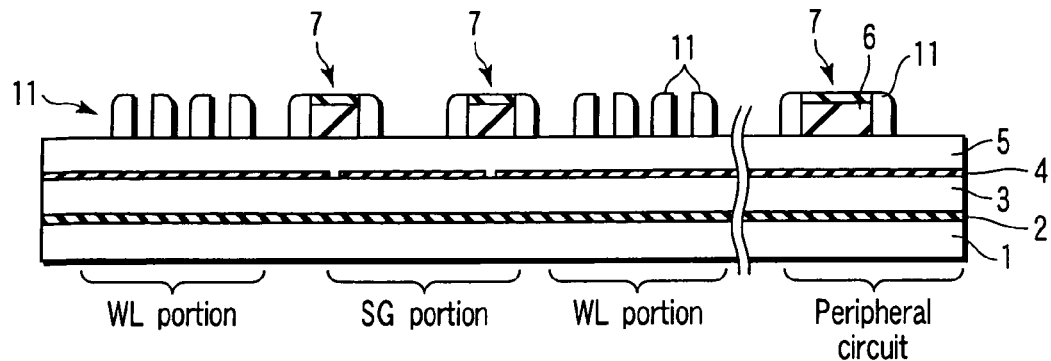

As depicted in FIG. 34, the stacked pattern comprising hard mask 7/BSG 6' of the exposed area is removed using etching process. In this case, isotropic etching process such as CDE process or wet process is used as the etching process in general. The process is determined depending on the hard mask material. For example, if a SiN film is selected as the hard mask 7, wet etching using hot phosphoric acid is used. The hard mask 7 of the WL portion is removed, and thereafter, the resist pattern 9 is removed. As the resist removal process, ashing process at oxygen atmosphere ($O_2$ asher) is used in general. Via the foregoing processes, the WL portion is formed with the sidewall spacer 11 at a pitch twice as many as the final transistor pattern pitch. Moreover, SG portion and peripheral circuit are each formed with the stacked layer comprising hard mask 7/BSG film 6 and sidewall spacer 11.

Figure 35:
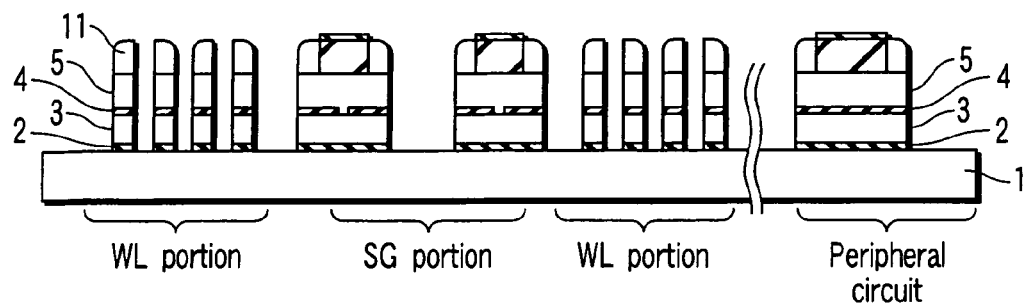
Figure 36:
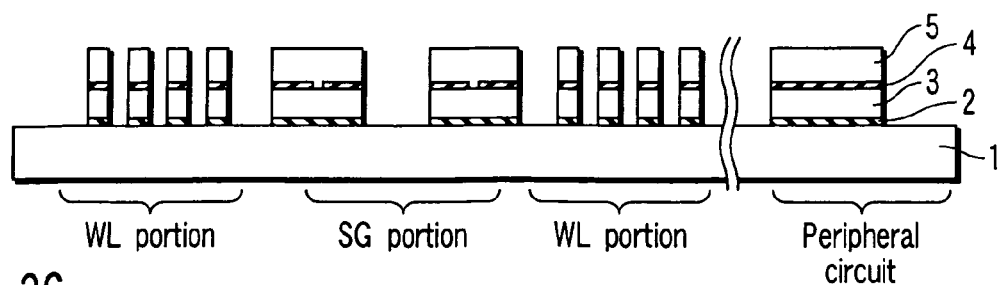

As seen from FIG. 35, the front-end, that is, the gate structure (tunnel oxide film 2/first polysilicon film 3/$Al_2O_3$ film 4/second polysilicon film 5) of the NAND flash memory is formed in the following manner. In the WL portion, etching is carried out using the sidewall spacer 11 as a mask. In the SG portion and the peripheral circuit, etching is carried out using sidewall spacer 11, hard mask pattern 7 and BSG film 6 as a mask. Finally, as shown in FIG. 36, sidewall spacer 11, hard mask pattern 7 and BSG film 6, which are used as a mask, are removed using etching.

According to the third embodiment, patterns having no misalignment are formed between portion and WL portion and between peripheral circuit and WL portion.

(Fourth Embodiment)

Figure 37:
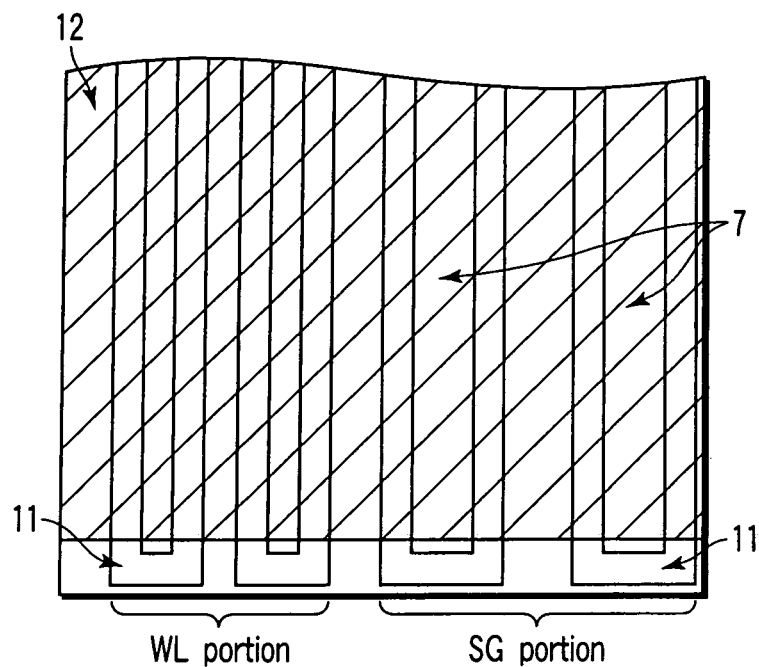
FIG. 37 is a top plan view to explain the method of manufacturing a NAND flash memory according to a fourth embodiment of the present invention.
Figure 38:
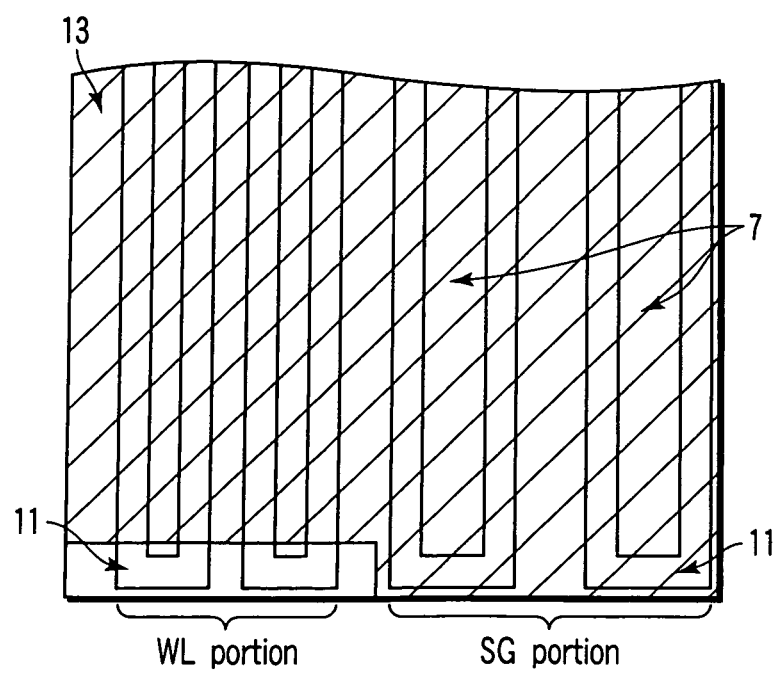
FIGS. 38 and 39 are top plan views to explain the process of manufacturing a NAND flash memory according to a fourth embodiment of the present invention.
Figure 39:
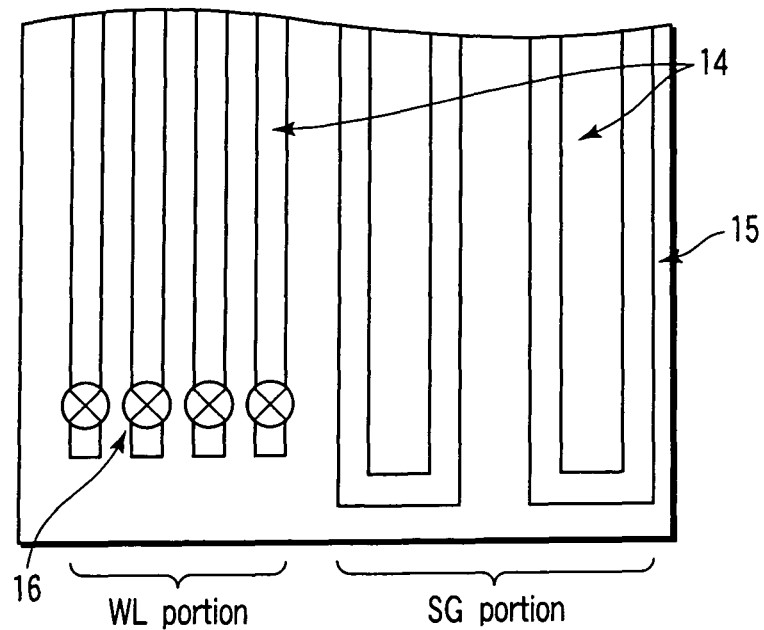

FIGS. 37 to 39 show an integrated circuit pattern forming method according to the fourth embodiment of the present invention. Patterns formed via the pattern forming process using sidewall spacers are given as closed loop pattern. Thus, in order to obtain an integrated circuit pattern, the line end portion pattern must be cut off.

Two methods are given as the method of cutting of the line end pattern. One is a method of exposing both line end portions of WL portion sidewall end and others (SG portion, peripheral circuit) by forming a resist pattern 12 via lithography process, as shown in FIG. 37. Timing of introducing the lithography process is desirable after the BSG film mask 6' of the WL portion in the process flow described in the first and second embodiments. Portion where the sidewall pattern 11 is exposed is removed using etching.

Another is a method of exposing WL portion sidewall end only while covering other line end portion (SG portion, peripheral circuit) with a resist pattern 13 via lithography process, as shown in FIG. 38. The hard mask 7 remains in portions other than the WL portion, and thereby, closed loop pattern is not given. Thus, line end portions other than WL portion may be covered with the resist pattern 13. The foregoing end portion process is carried out, and thereafter, interconnect patterns 14 are embedded using an interlayer insulating film 15. Thereafter, the interconnect pattern is connected with a contact 16, and then, via the process, an end portion pattern shown in FIG. 39 is formed.

Figure 40:
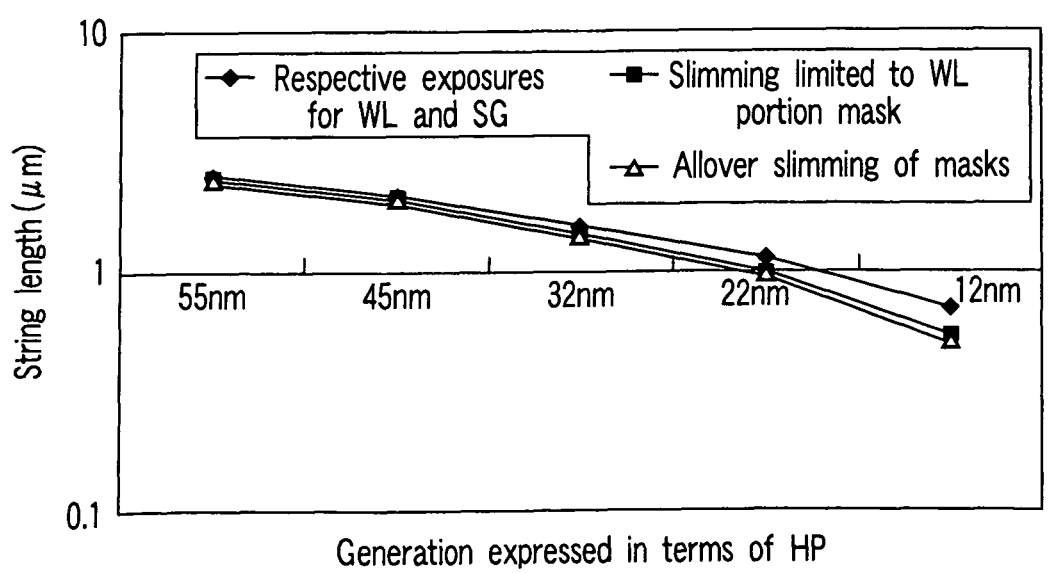
FIG. 40 is a graph to explain the effect of the present invention.

FIG. 40 shows the result of making a comparison of NAND string length between conventional respective exposure for WL and SG (type A) and the first embodiment (type B), the second or third embodiment (Type C). In the graph of FIG. 40, the horizontal axis takes generation expressed in term of half pitch (HP).

With advanced in the scaling down, there is a big difference in the NAND string length between Type A, Type B and Type C. The reason is as follows. The gate pattern of the NAND flash memory has the following. 5: features. Specifically, the dimensional scaling down advances, but the scaling down in the vertical direction (height) does not advance. The aspect ratio becomes high with the scaling down. For this reason, device characteristic asymmetry is given by ion implantation; however, shrink in the distance between WL1-SG for preventing the foregoing influence is not given in accordance with advance in generation.

As seen from FIG. 40, the following result is obtained in the 12 nm generation. Namely, according to the process (Type B, type C) of this embodiment, the string length becomes 25% shorter than respective exposure for WL and SG (Type A). The difference is intactly equivalent to the difference of the memory cell area. A memory cell occupancy (usually, 60 to 80%) is multiplied, and thereby, the difference can be seen in the chip size. The foregoing process of the embodiments is used, and thereby, the chip size is made small, and a desired device characteristic is obtained. In addition, a semiconductor integrated circuit device is realized at low cost.

According to the present invention, there is provided an integrated circuit pattern forming method, which can prevent characteristic unbalance based on misalignment and wastefulness of chip area, and simplify the process.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device comprising:

forming a stacked film including a first layer, a second layer, and a third layer on a substrate, the first layer being formed on the second layer, the second layer being formed on the third layer, and the third layer being formed on the substrate;

forming a first resist pattern on the stacked film;

forming a first film pattern of the first layer by etching the uppermost layer of the stacked film, which is the first layer, using the first resist pattern as a mask;

after removing the first resist pattern, covering a first part of the first film pattern with a second resist pattern;

slimming a second part of the first film pattern on an area exposed from the second resist pattern using etching;

removing the second resist pattern, thereby forming a second film pattern of the first layer;

etching the second layer with the second film pattern, thereby forming a third film pattern comprised of stacked parts of the first layer and the second layer, the third film pattern including a first part corresponding to the first part of the first film pattern and a second part corresponding to the second part of the first film pattern, a pattern width of the first part of the third film pattern not having been slimmed and a pattern width of the second part of the third film pattern having been slimmed by the slimming the second part of the first film pattern on the area exposed from the second resist pattern;

after the etching the second layer with the second film pattern, covering the first part of the third film pattern with a third resist pattern;

removing portions of the first layer of the first film pattern on an area exposed from the third resist pattern using etching, so that portions of the second layer under the removed portions of the first layer remain;

after removing the third resist pattern, forming sidewall spacers at respective sidewalls of the first part of the third film pattern and the remained portions of the second layer in a corresponding part to the second part of the third film pattern;

after the forming the sidewall spacers at respective sidewalls of the first part of the third film pattern and the remained portions of the second layer in the corresponding part to the second part of the third film pattern, removing the remained portions of the second layer exposed;

etching the third layer using unremoved portions of the first layer in the corresponding part of the first part of the third film pattern and the sidewall spacers as masks, thereby forming a fourth film pattern; and after the forming the fourth film pattern, removing the unremoved portions of the first layer and the second layer of the fourth film pattern and the sidewall spacers to leave a fifth film pattern comprised of portions of the third layer.

2. The method according to claim 1, wherein the covering the first part of the first film pattern with the second resist pattern and the covering the first part of the third film pattern with the third resist pattern include lithography using the same exposure mask.

3. The method according to claim 1, further comprising:
after the forming the sidewall spacers, forming a fourth resist pattern to expose part of a closed loop formed by the sidewall spacers; and
removing part of the sidewall spacers exposed from the fourth resist pattern.

4. The method according to claim 1, wherein the slimming the first film pattern using etching includes slimming the first film pattern to a range from 0.4 to 0.6 of a minimum pattern dimension.

5. The method according to claim 1, wherein the leaving the fifth film pattern includes forming a plurality of transistors, and sizes of the transistors formed on a corresponding part to the first part of the first film pattern are larger than those of the transistors formed on a corresponding part to the second part of the first film pattern.

6. The method according to claim 1, wherein the leaving the fifth film pattern includes forming a pattern of a semiconductor memory device including a plurality of transistors, the transistors on a corresponding part to the first part of the first film pattern include peripheral circuit transistors of the semiconductor memory device, and the transistors on a corresponding part to the second part of the first film pattern include memory transistors of the semiconductor memory device.

7. The method according to claim 6, wherein the semiconductor memory device is a NAND flash memory, and the transistors in the corresponding part to the first part of the first film pattern include selection transistors of the NAND flash memory.

8. A method of manufacturing a semiconductor device comprising:
forming a stacked film including a first layer, a second layer and a third layer on a substrate, the first layer being formed on the second layer, the second layer being formed on the third layer, and the third layer being formed on the substrate;
forming a first resist pattern on the stacked film, the first resist pattern being comprised of a first part and a second part, a line width of the first part being wider than a line width of the second part;
forming a first film pattern, by etching the uppermost layer of the stacked film, which is the first layer, using the first resist pattern as a mask, the first film pattern being comprised of a third part and a fourth part, formed according to the first part and the second part, respectively, a line width of the third part being wider than a line width of the fourth part;
after removing the first resist pattern, slimming every pattern of the first film pattern using etching;
etching the second layer using the first film pattern after the slimming as a mask, thereby forming a second film pattern including portions of the first layer stacked on portions of the second layer;
forming a second resist pattern covering a fifth part of the second film pattern, the fifth part being positioned on the third part of the first film pattern prior to the slimming;
removing the portions of the first layer of the second film pattern on an area exposed from the second resist pattern using etching so that the portions of the second layer under the portions of the first layer remain and are exposed;
after removing the second resist pattern, forming sidewall spacers at respective sidewalls of the second film pattern in the fifth part, and the remained portions of the second layer in a sixth part, the sixth part being positioned on the fourth part of the first film pattern prior to the slimming;
after forming the sidewall spacers, removing the remained and exposed portions of the second layer to form a third film pattern;
etching the third layer using the third film pattern as a mask to form a fourth film pattern; and
after forming the fourth film pattern, removing the remained portions of the first layer, the second layer formed under the first layer, and the sidewall spacers to leave a fifth film pattern comprised of portions of the third layer.

9. The method according to claim 8, further comprising:
after forming the sidewall spacers, forming a fourth resist pattern so as to expose part of a closed loop formed by the sidewall spacers; and
removing the exposed part of the closed loop formed by the sidewall spacers.

10. The method according to claim 8, wherein the slimming every pattern of the first film pattern using etching includes to slim the first film pattern to a range from 0.4 to 0.6 of a minimum pattern dimension.

11. The method according to claim 8, wherein the leaving the fifth film pattern includes forming a plurality of transistors, and sizes of the transistors formed on a corresponding part to the third part of the first film pattern are larger than those of the transistors formed on a corresponding part to the fourth part of the first film pattern.

12. The method according to claim 8, wherein said leaving the fifth film pattern includes forming a pattern of a semiconductor memory device including a plurality of transistors, the transistors on a corresponding part to the third part of the first film pattern include peripheral circuit transistors of the semiconductor memory device, and the transistors on a corresponding part to the fourth part of the first film pattern include several memory transistors of the semiconductor memory device.

13. The method according to claim 12, wherein the semiconductor memory device is a NAND flash memory, and the transistors on the corresponding part to the third part of the first film pattern include selection transistors of the NAND flash memory.

\* \* \* \* \*